United States Patent [19]

Sadamori

[11] Patent Number: 5,313,966
[45] Date of Patent: May 24, 1994

[54] IMMERSION CLEANING DEVICE

[75] Inventor: Masaaki Sadamori, Fukuoka, Japan

[73] Assignee: Mitsubishi Denki Kabushiki Kaisha, Tokyo, Japan

[21] Appl. No.: 727,761

[22] Filed: Jul. 10, 1991

[30] Foreign Application Priority Data

Jul. 31, 1990 [JP] Japan .................................. 2-201408

[51] Int. Cl.5 .................................................. B08B 3/04
[52] U.S. Cl. ..................................... 134/76; 134/200;
134/902; 134/147; 134/154
[58] Field of Search .................. 134/76, 902, 77, 180,
134/164, 61, 135, 147, 148, 154, 200, 62, 66, 69,
85, 114, 137, 140; 277/237 A, DIG. 9, DIG. 4

[56] References Cited

U.S. PATENT DOCUMENTS

| | | | |
|---|---|---|---|
| 3,143,975 | 8/1964 | Abbey | 134/76 |
| 3,335,839 | 8/1967 | Neumann | 134/76 |
| 3,426,772 | 2/1969 | Foster | 134/164 X |
| 4,493,333 | 1/1985 | Layton | 134/76 |
| 4,520,834 | 6/1985 | DiCicco | 134/76 X |
| 4,714,010 | 12/1987 | Smart | 134/76 |
| 4,832,066 | 5/1989 | Shipman | 134/137 |
| 4,881,561 | 11/1989 | Schwarzwalder | 134/200 |

FOREIGN PATENT DOCUMENTS 1-265519 10/1989 Japan .

Primary Examiner—Frankie L. Stinson
Attorney, Agent, or Firm—Lowe, Price, LeBlanc & Becker

[57] ABSTRACT

An immersion cleaning device is provided with concave portions housing respective chemical baths into which a workpiece is selectively immersed. Any gas and mist generated from the chemical baths is exhausted from the concave portions. A transportation element has a portion to hold a workpiece with takes the workpiece into or out from the chemical bath. A controller is included to control operation of transportation means. An enclosure body moves with the holding portion and is moved with the workpiece to substantially enclose any gases and chemical mist generated during the transportation. Corrosion of the device and pollution which might be caused by leaks of gases and mist to the outside are thus prevented.

4 Claims, 12 Drawing Sheets

IMMERSION CLEANING DEVICE

BACKGROUND OF THE INVENTION

1. Field of the Invention

The present invention relates to improvements to an immersion device, in which a workpiece such as a semiconductor wafer is immersed into a chemical and cleaned.

2. Description of the Prior Art

In production of semiconductor devices such as LSI, various kinds of fine particle dust is generated due to various reasons. For example, there are process dust caused in the process of diffusion, CVD or ion injection, and mechanical dust caused in the process of handling, storage or transportation. When such fine particle adheres to semiconductor wafer, that greatly affects production yield of semiconductor device. Accordingly, the semiconductor wafer must be cleaned in production of the semiconductor device. Generally 5-10 processes are repeated for the cleaning process of the semiconductor wafer. In the cleaning method, there are wet-type cleaning device which removes dirt using liquid such as chemical or pure wafer, and dry-type cleaning device which uses no liquid. An immersion cleaning device can clean all of various particles with low cost, and effectively. FIG. 1 shows the immersion cleaning device as an example of former wet-type cleaning device. In the figure, an immersion cleaning device 1 is composed of ceiling portion 1a, cleaning bath portion with a plurality of cleaning bath (chemical bath or pure water bath) 10b, loader portion 1c, unloader portion 1d and work transportation portion 1e. Specified number of magazine If mounted with semiconductor wafer is put on loader portion. Upon this, when cleaning conditions is inputted into controller 1g, work transportation portion 1e chucks magazine 1f with clicks 1i, puts it into cleaning bath 10b and cleans semiconductor wafer, and semiconductor wafer is dried at IPA (isopropyl alcohol) vapor drier 1h situated at unloader portion 1d. When cleaning treatment is completed, controller 1g inform operator of the completion. As sequence of cleaning treatment for semiconductor wafer, there are, for example, the following: heated concentrated nitric acid— pure water—heated cencetrated sulfuric acid —pure water—dilute hydrofuluoric acid—pure water—IPA drier; (ammonia water+hydrochloric acid)—pure water dilute hydrofluoric acid pure water IPA vapor drier. When the device, as shown in FIG. 1, has a plurality of work transportation portion 1e, range of cleaning bath 1b, which each work transportation portion 1e takes charge of, is specified, and each transportation portion 1e takes the magazine 1f into and from the cleaning bath. (Upon this, cleaning bath ranges, which neighboring work transportation portion 1e takes charge of, partially lap.)

There is sometimes an immersion cleaning device, in which, to prevent contamination due to fine particle on semiconductor wafer and mist, clean air having passed through high performance filter is flowed downward from ceiling portion 1a to be exhausted through exhaust hole (exhaust means) 1j, and by this, inside of the immersion cleaning device 1 is kept clean and gas generating from cleaning bath 10b is suppressed. In reference to FIG. 2, an example of a cleaning process in such device for semiconductor wafer is still explained in detail. Each cleaning bath 10b-10b-3 is housed in concave portions formed on upper surface of the cleaning portion 1b. To begin with, magazine 1f is immersed for 10 min. in heated concentrated nitric acid bath 10b-1. Then, work transportation portion 1e holds the magazine 1f and transports it to pure water bath 10b-2. After cleaning semiconductor wafer for 110 min. in the pure water bath 1b2, the work transportation portion 1e again holds the magazine 1f and transport it to dilute fluoric acid bath 10b-3 3 to immerse it for 5 min.. Then, the work transportation portion 1e again transport the magazine 1f to the following bath. In this way, the magazine is put in or taken out from chemical bath to clean semiconductor wafer in the magazine. Upon this, clean air 1k blown out from ceiling portion 1a is exhausted by exhaust means 1m through exhaust hole 1j together with gas generating from each cleaning bath 10b. In the figure, clean air 1k is shown only above the cleaning bath 10b-2, but the cleaning air is generally blown out over the entire cleaning bath portion 1b from ceiling portion 1a. In the case of the above device, almost all gases generating from cleaning bath (for example, cleaning bath 10b-3 in FIG. 8), in which magazine 1f mounted with semiconductor wafer as work is completely immersed, and generating from cleaning bath (for example, cleaning bath 10b-1), in which magazine 1f is not immersed, are exhausted through each hole 1j. However, gas generating from chemical adhering to magazine 1f or to semiconductor wafer (work), during transportation (for example, as shown in the above of clearing bath 10b-2 in FIG. 2), is not completely absorbed through exhausted hole 1j and stirred by clean air 1k blown out from ceiling portion 1a. In addition, when chemical is heated, the specific gravity becomes less than air, so that the gas is scattered in upper or side direction going counter flowing direction of the clean air 11k. In this case, part of chemical combines with moisture in the air to become mist, and is scattered to outside of the immersion cleaning device 1 together with gas. Gas or mist generating from chemical is often acid or alkaline. Accordingly, if such gas or mist is scattered to outside of the immersion cleaning device is not only corrodes or deteriorates surrounding parts, but also gives unfavorable effects to human bodies.

In addition, in the case of above device in which clean air is blown out, part of scattered gas or mist is again taken into the high performance filter at the ceiling portion 1a together with room air and circulates through the device and concentrates in proportion to operation time. As result, the high performance filter and motor fan are corroded. Beside, if the work transportation portion 1e and senser system of the device are corroded, operation error of the device is sometimes caused. This not only leads to poor cleaning and damage of the semiconductor wafer, but also dangerous to an operator. Conventional device has the above problems.

SUMMARY OF THE INVENTION

According to the present invention, in an immersion cleaning device equipped with concave portion housing chemical bath in which work is immersed, exhaust means provided to exhaust gas and mist generated from the chemical bath housed in the concave portion, and control portion to control operation of transportation means, work and grip of transportation means are enclosed by an enclosure body, which substantially encloses gas and mist generating from work during transportation.

Accordingly, there is provided in immersion cleaning device, which can enclose gas and mist generating from work such as semiconductor wafer during transportation within an enclosure body and surely exhaust them, so that the invention can prevent corrosion and deterioration of in-and out-part of the device, caused by gas and mist covered, and has an effect that is can protect operator's labor environment.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a front sectional view of main part, showing a second embodiment of the present invention.

DESCRIPTION OF THE PREFERRED EMBODIMENT

Figure 1:
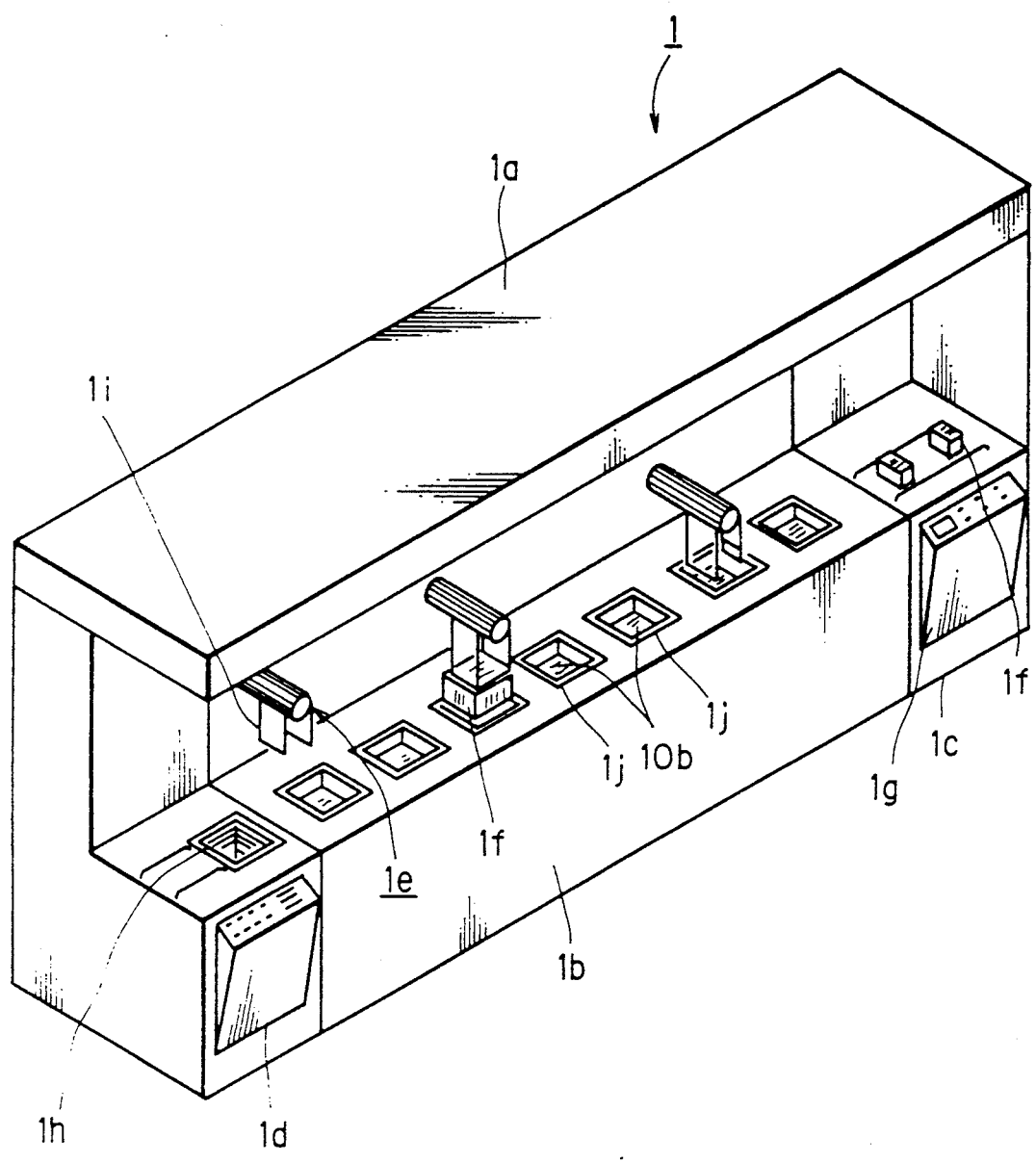
FIG. 1 is an overall cross view of conventional immersion cleaning device.
Figure 2:
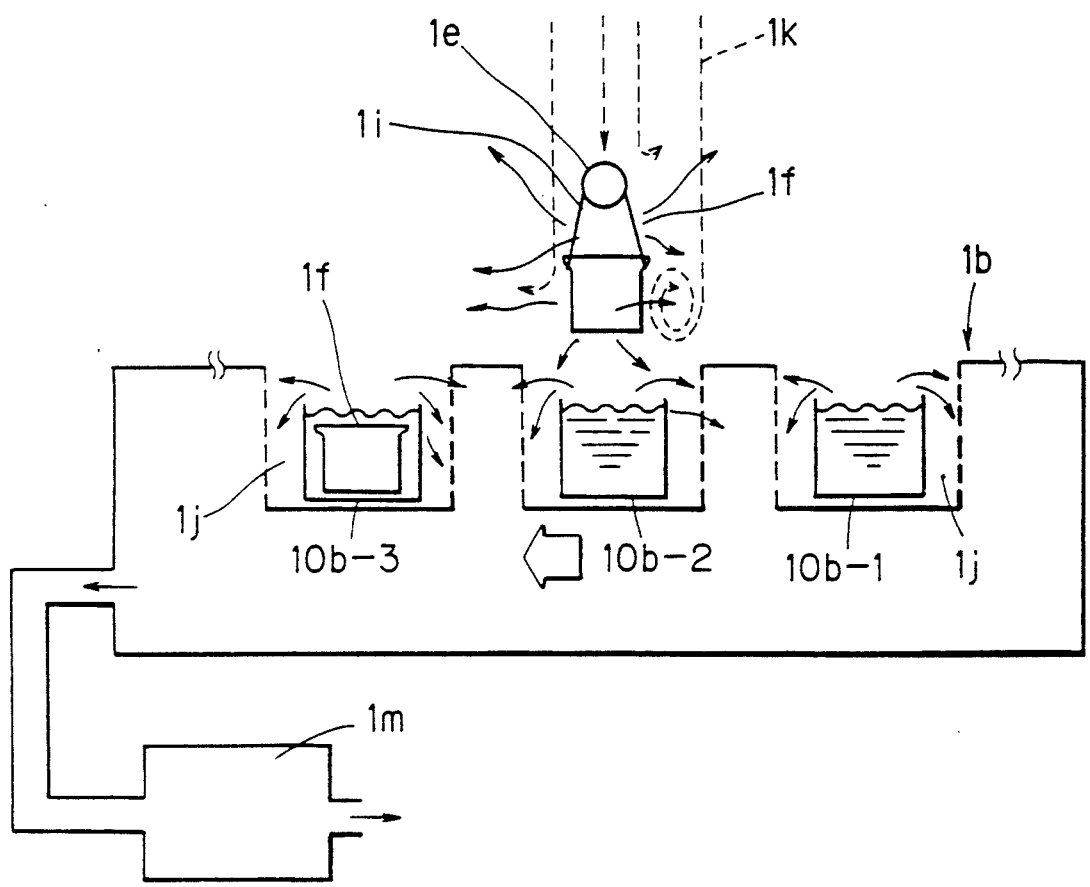
FIG. 2 is partial front sectional view showing operation principle of conventional immersion cleaning device.
Figure 3:
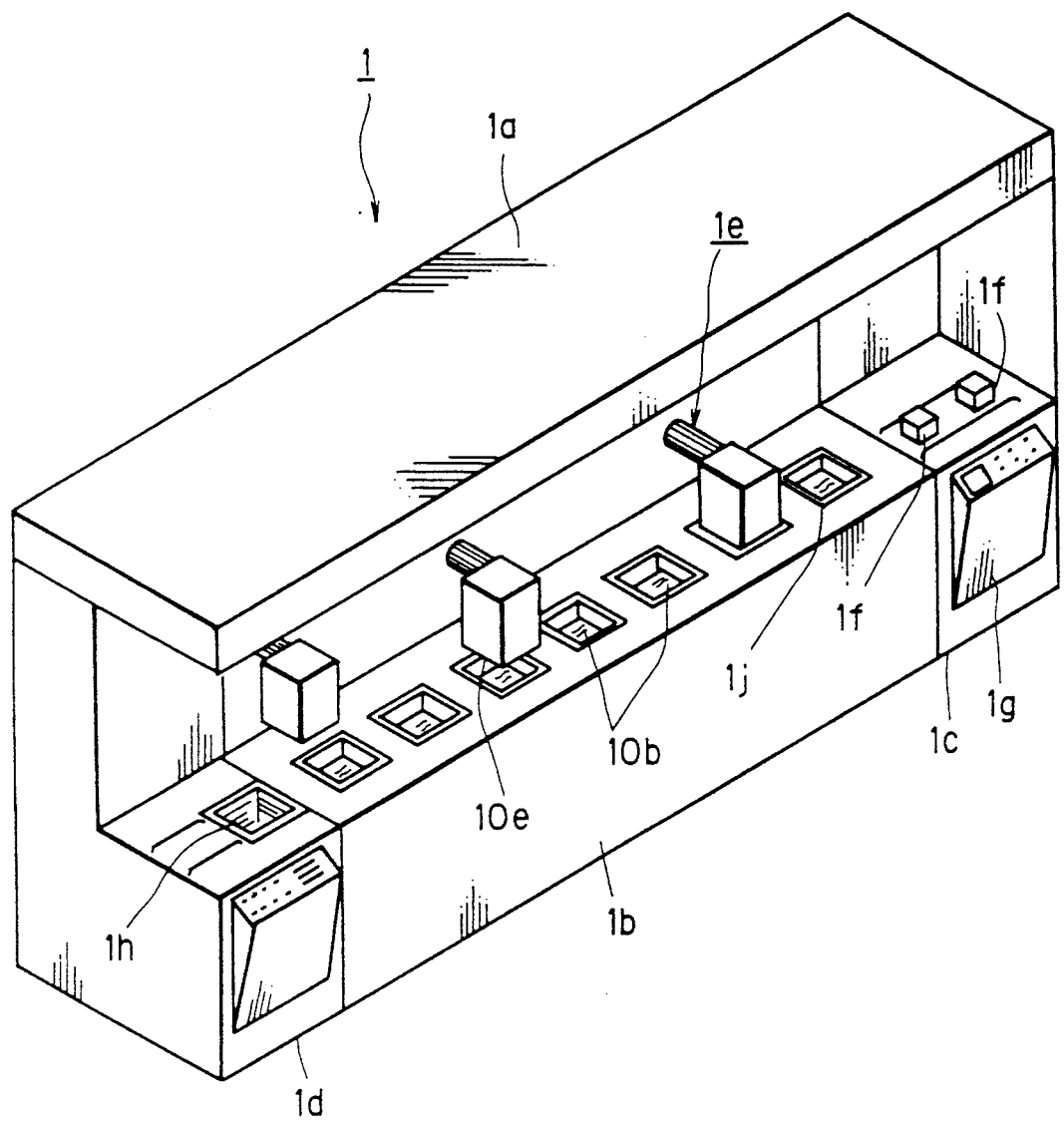
FIG. 3 is overall cross view of a first embodiment of the present invention.
Figure 4:
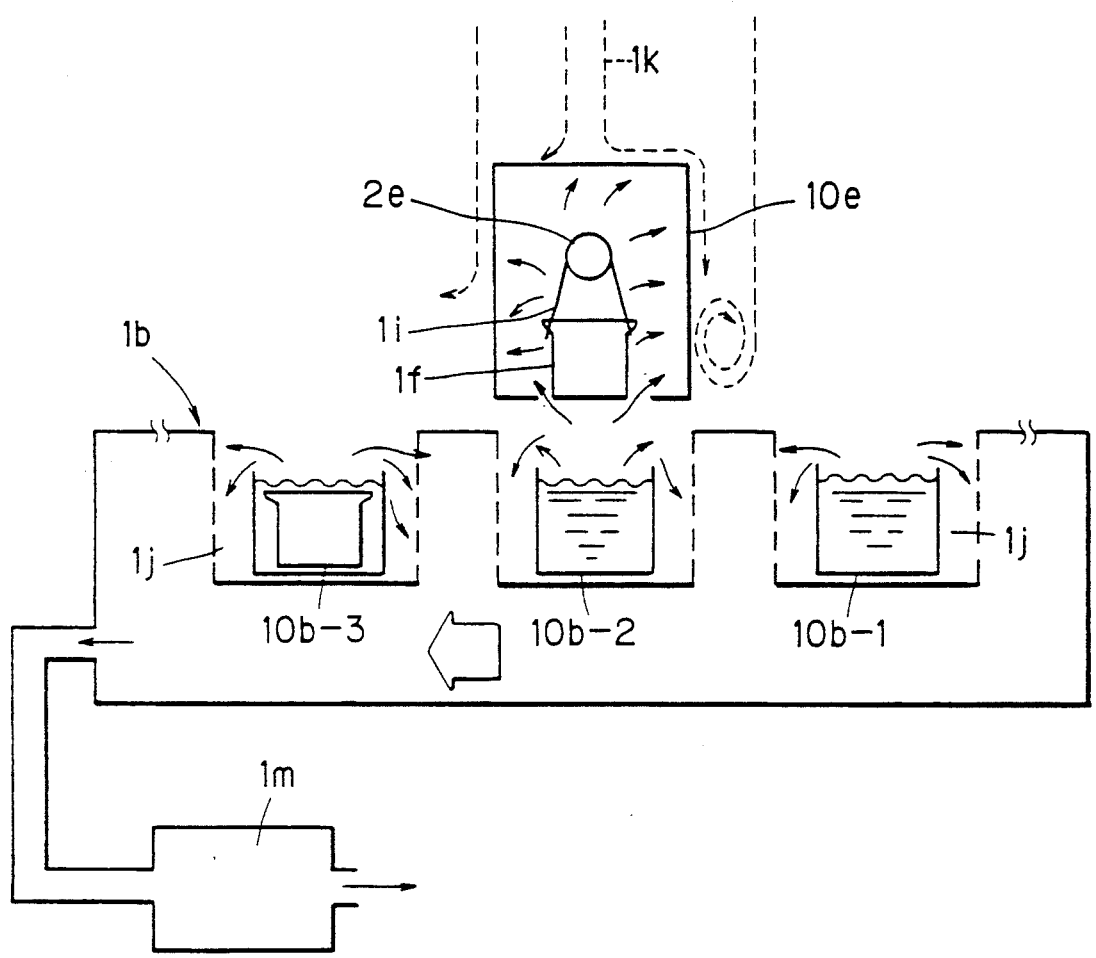
FIG. 4 is front sectional view of the main part of the first embodiment.

FIGS. 3 and 4 show a first embodiment of the present invention. In the FIGS., 1a-1j and 1m are the same as shown in the above FIGS. 1 and 2, so that the description is omitted. An enclosure body 10e made of, for example, vinyl chloride resin plate, encloses grip portion (that is, nail 1i and horizontal bar portion 2e attached with the nail 1i) of each work transporter 1e, and the upper part and four sides of the magazine 1f gripped thereby. The magazine 1f is loaded with an exemplary workpiece, e.g., a semiconductor wafer, as work to be cleaned. Each enclosure body 10e is attached to horizontal bar portion 2e of work transporter 1e so that the enclosure body is slidable in a vertical direction. Accordingly, for example, when horizontal bar portion 2e of the work transporter 1e lowers from a position in FIG. 4 to immerse magazine 1f into cleaning bath 10b-2, a bottom surface of enclosure body 10e, which lowers as the horizontal bar portion 2e lowers, contacts an upper surface of cleaning bath portion 1b, and stops. When work transporter 1e further lowers, magazine 1f lowers, leaving enclosure body 10e at its stopping position, and magazine 1f is immersed in cleaning bath 10b-2. When immersion of magazine 1f in cleaning bath 10b-2 is completed, work transporter 1e again reised and horizontal bar portion 2e comes to an upper limit of sliding region of enclosure body 10e, enclosure body 10e is again moved by work transporter 1e, and moves to the next cleaning bath.

Consequently, even during transportation of magazine 1f, gas mist generating from chemical adhering to magazine 1f or the semiconductor wafer (work), is enclosed in the enclosure body 10e and is not scattered. In this embodiment, the lower portion of the enclosure body 10e is opened to put in or take out magazine 1f, but gas or mist scattered therefrom is almost completely exhausted by exhaust means 1m through exhaust hall 1j. And, as shown in FIG. 4, also when clean air 1k is blown out, as enclosure body 10e intercepts clean air 1k, gas or mist generating from magazine 1f or semiconductor wafer are not stirred by the clean air 1k.

Figure 5:
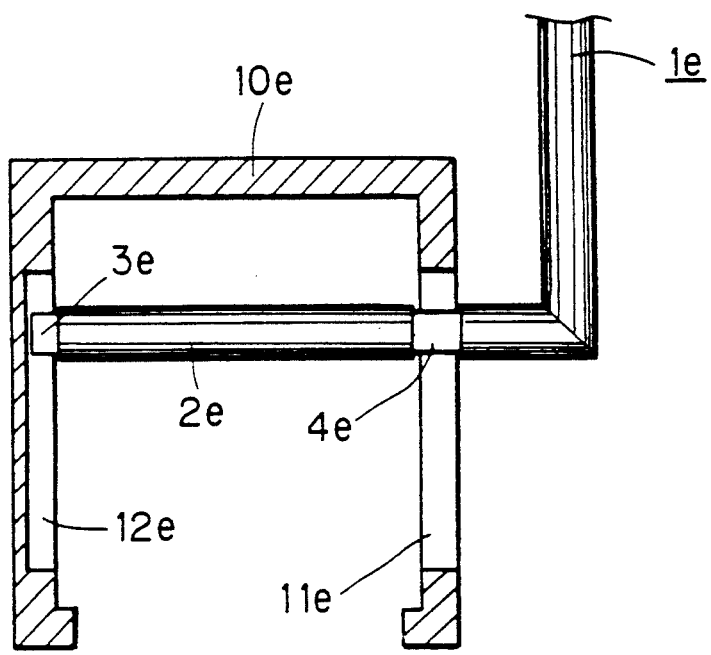
FIG. 5 is sectional view showing a sliding portion between an enclosure body and horizontal bar portion of work transporter, in the first embodiment.
Figure 6:
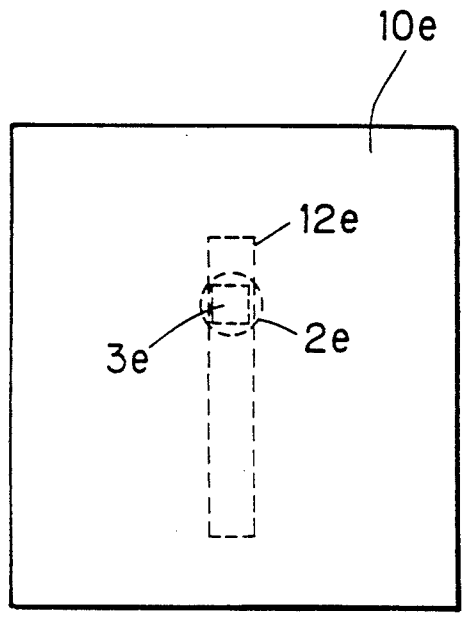
FIG. 6 is a front view showing relationship between an enclosure body and horizontal bar portion of work transporter, in the first embodiment.
Figure 7:
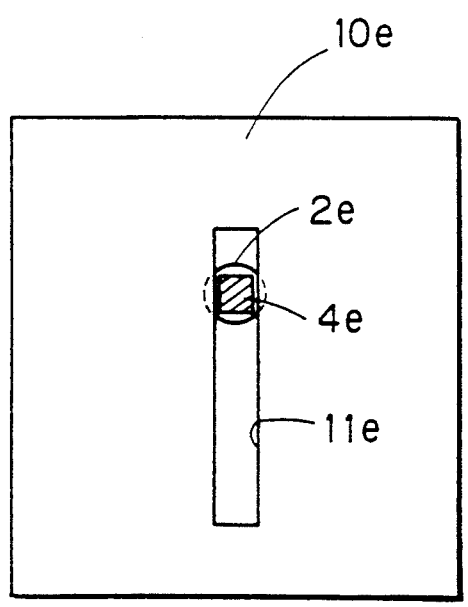
FIG. 7 is a back side view showing relationship between an enclosure body and horizontal bar portion of work transporter, in the first embodiment.

In the next place, with reference to FIGS. 5-7, a sliding mechanism of enclosure body 10e and horizontal bar portion 2e of work transporter 1e, is explained.

FIG. 5 is vertical sectional view, in which enclosure body 10e is attached to horizontal bar portion 2e, and FIG. 6 is erection view of enclosure body 10e, and FIG. 7 is back side view of the same. Upon this, horizontal bar portion 2e in FIG. 7 is shown at section at sliding portion 4e for convenience of explanation.

The enclosure body 10e has formed in it a long hole 11e in a vertical direction of side surface of the back portion, and has a long groove 12e at inside of front side surface, which faces the long hole 11e. The long hole 11e and long groove 12e are engaged with sliding portions 3e and 4e of horizontal bar portion of work transportation portion 1e, to be slidable. Section of slidable portions 3e and 4e is formed to be rectangular as shown in FIGS. 6 and 7, and contacts with inner surface of long hole 11e and long groove 12e so that enclosure body 10e is not inclined even if work transporter 1e moves in a horizontal direction. FIGS. 8-11 show a seal mechanism, which prevents leak of gas or mist, which is sealed within enclosure body 10e, through long hole 11e.

Figure 8:
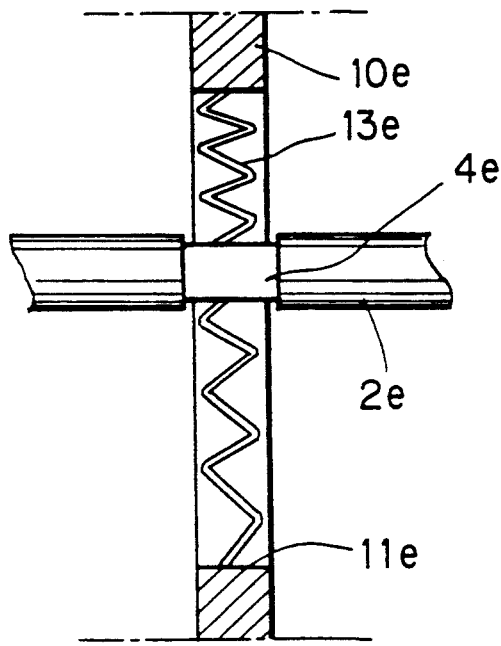
FIG. 8 is sectional view of main part, showing a seal mechanism for long hole provided at the back of enclosure body.
Figure 9:
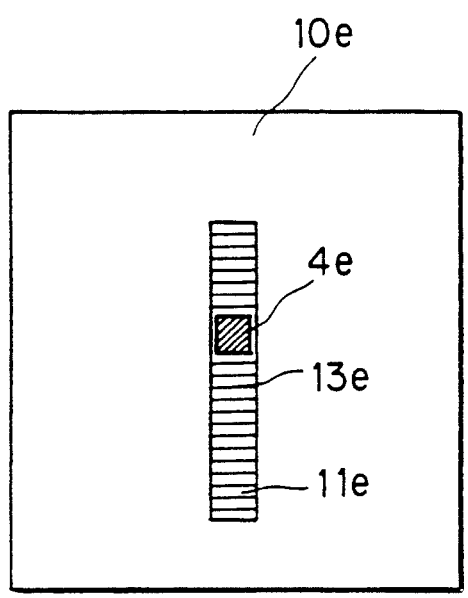
FIG. 9 is the seal mechanisim in FIG. 8, viewed from the back of an enclosure body.

FIG. 8 is sectional view of main part, in which bellows-like shutter 13e is provided in long hole 11e. FIG. 9 is a view, in which the enclosure body 10e is seen from the back. The bellows-like shutter 13e is made of flexible material which is corrosion-resistance against gas or mist generating within the enclosure body 10e, the upper end and the lower end are fixed to the upper and the lower inside of the long hole 11e, and bar portion 2e is inserted into and fixed to, with the sliding portion 4e, a hole provided at the center.

Through this bellows-like shutter 13e, sliding portion 4e can freely slide without inside gas or mist leaking through long hole 11e.

Figure 10:
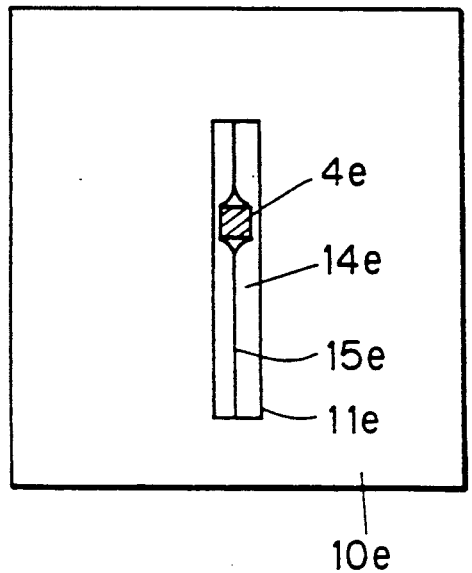
FIG. 10 is a back side view showing a second seal mechanism of long hole, provided at the back of an enclosure body.

FIG. 10 is a back side view, in which film 14e made of elastic member such as rubber is used instead of the above bellow-like shutter 13e.

In the figure, film 14e made of rubber is fixed to long hole 11e, slit 15e is provided at the center in the longitudinal direction. The film 14e is made of elastic member such as rubber, so that it can freely bend in a transverse direction, sliding portion 4e can freely move up and down, keeping seal effect.

Figure 11:
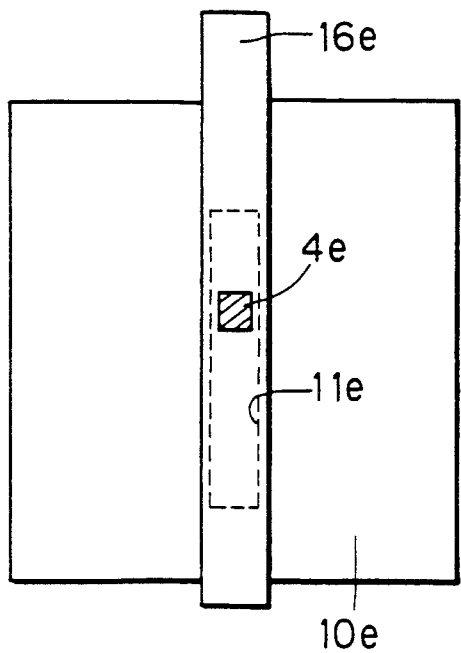

FIG. 11 is a view in which instead of providing bellow-like shutter 13e in FIG. 8, shutter plate 16e covering long hole 11e is attached to sliding portion 4e.

By making longitudinal length of shutter plate 16e twice as much as longitudinal length of the long hole 11e, hole 11e is always covered by the shutter plate 16e, even if bar portion 2e slides in up and down direction of the enclosure body 10e.

However, in this example, as, when work transporter 1e lowers, lower edge of the seal plate 16e projected down the lower edge of the enclosure body 10e, proper groove is necessary so that lower edge of the seal plate 16e can enter exhaust hole 1j.

Upon this, in FIGS. 9-11, section at sliding portion 4e is shown for horizontal bar portion 2e for convenience of explanation.

Figure 12:
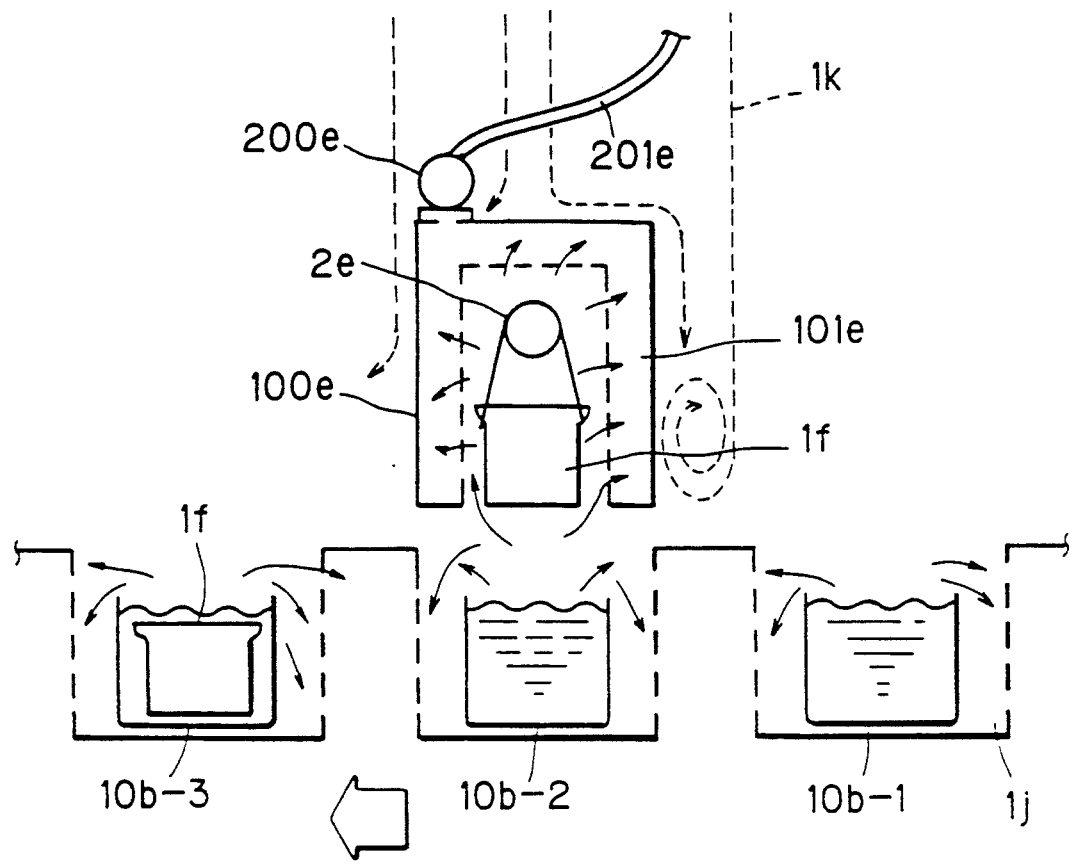
FIG. 12 is a back side view showing third seal mechanism of long hole, provided at the back of an enclosure body.

With reference to FIG. 12, a second embodiment of the present invention is explained.

Basic construction of the embodiment in FIG. 12 also the same as the device in FIGS. 3 and 4. However, in the embodiment in FIG. 12, each enclosure body 100e has exhaust space 101e enclosed by a gas-permeable inner wall (not numbered) inside it, gas or mist generating from magazine 1f and semiconductor wafer are collected by an exhaust pump 200e evacuating exhaust space 101e, which is provided on the enclosure body 100e, introduced to an exhaust duct (not shown) through tube 201e connected to the exhaust pump 200e, and exhausted. Accordingly, scattering of gas or mist is prevented still more effectively.

Figure 13:
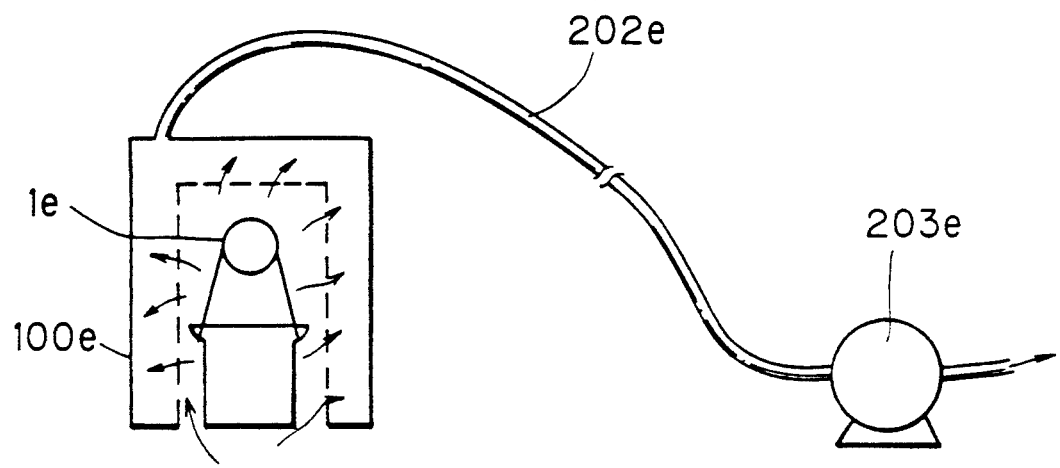
FIG. 13 is a schematic view of main part in case that special purpose tube is directly connected to an enclosure body in the second embodiment.

Or, the following may be possible: instead of providing exhaust pump 200e at the upper part of the enclosure body 100e, as shown in FIG. 13, flexible tube 202e is directly connected to the enclosure body 100e, the other edge of the exhaust tube 202e is connected to an exhaust pump 203e for exhaust, which is provided differently at immersion cleaning device.

Figure 14:
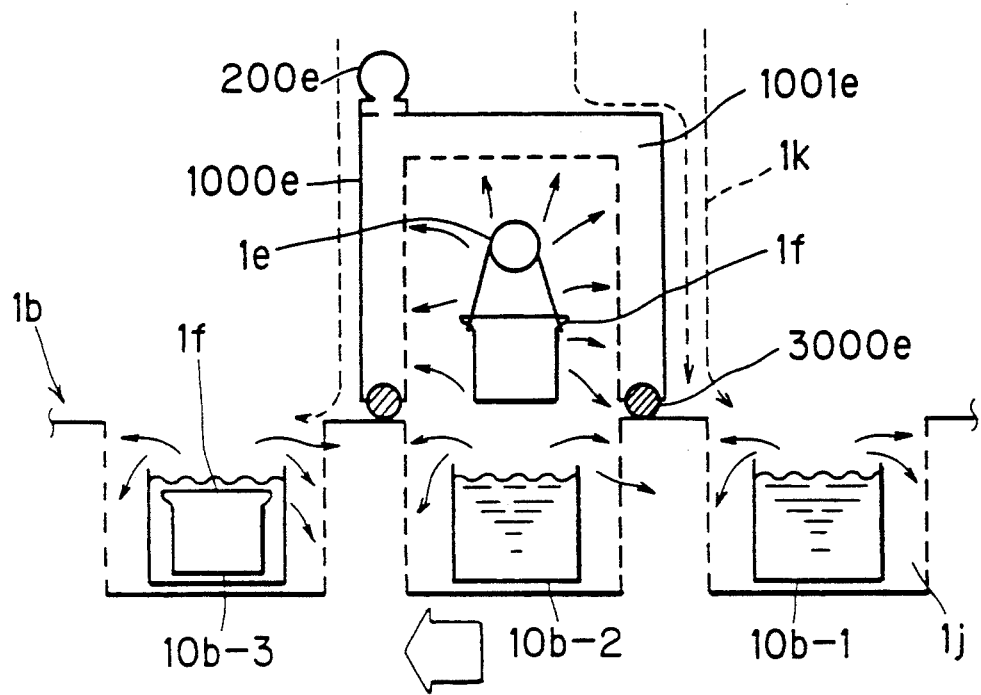
FIG. 14 is a front sectional view of main part, showing a third embodiment of the present invention

With reference to FIG. 14, a third embodiment of the present invention explained.

In an exhaust space 1001e is provided at an enclosure body 1000e, and not only it is exhausted by exhaust pump 200e but also cushion rubber is provided at the lower part of the enclosure body 1000e. Consequently, as shown in FIG. 14, at a position where enclosure body 1000e contacts with the upper surface of cleaning bath portion 1b, the enclosure body 1000e closely contacts with the upper surface of the cleaning bath portion 1b through the rubber cushion 3000e. Consequently, gas and mist generated during process of putting or taking magazine into or out of cleaning bath, do not leak outside and are completely collected. As cushion rubber material, it is preferable to use, for example Perfuroloelastomer, which is a elastic seal material with excellent chemical resistance and is available from Dupont named "Kalretz" rubber (trade name).

Figure 15:
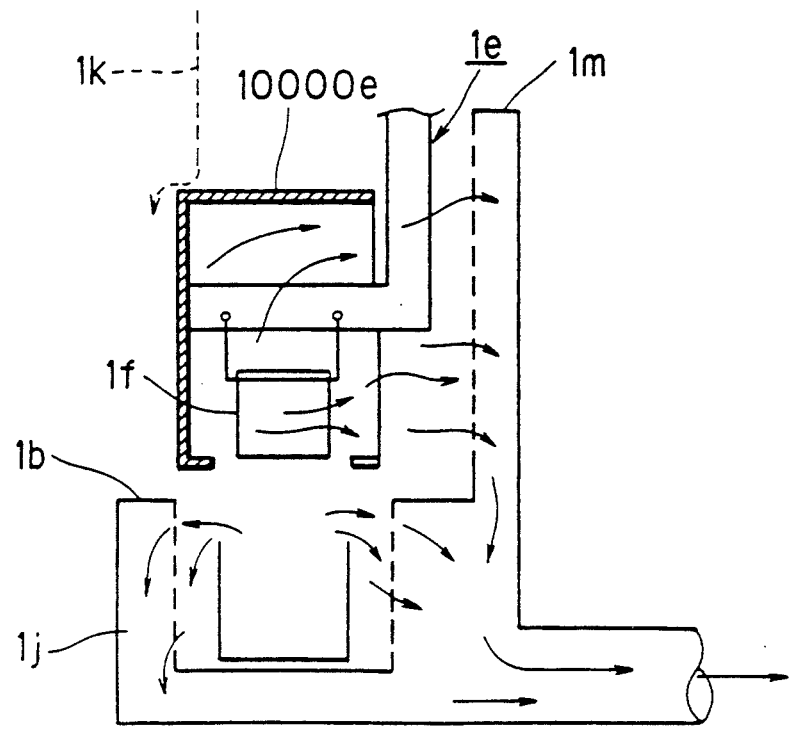
FIG. 15 is a side sectional view of main part, showing a fourth embodiment.
Figure 16:
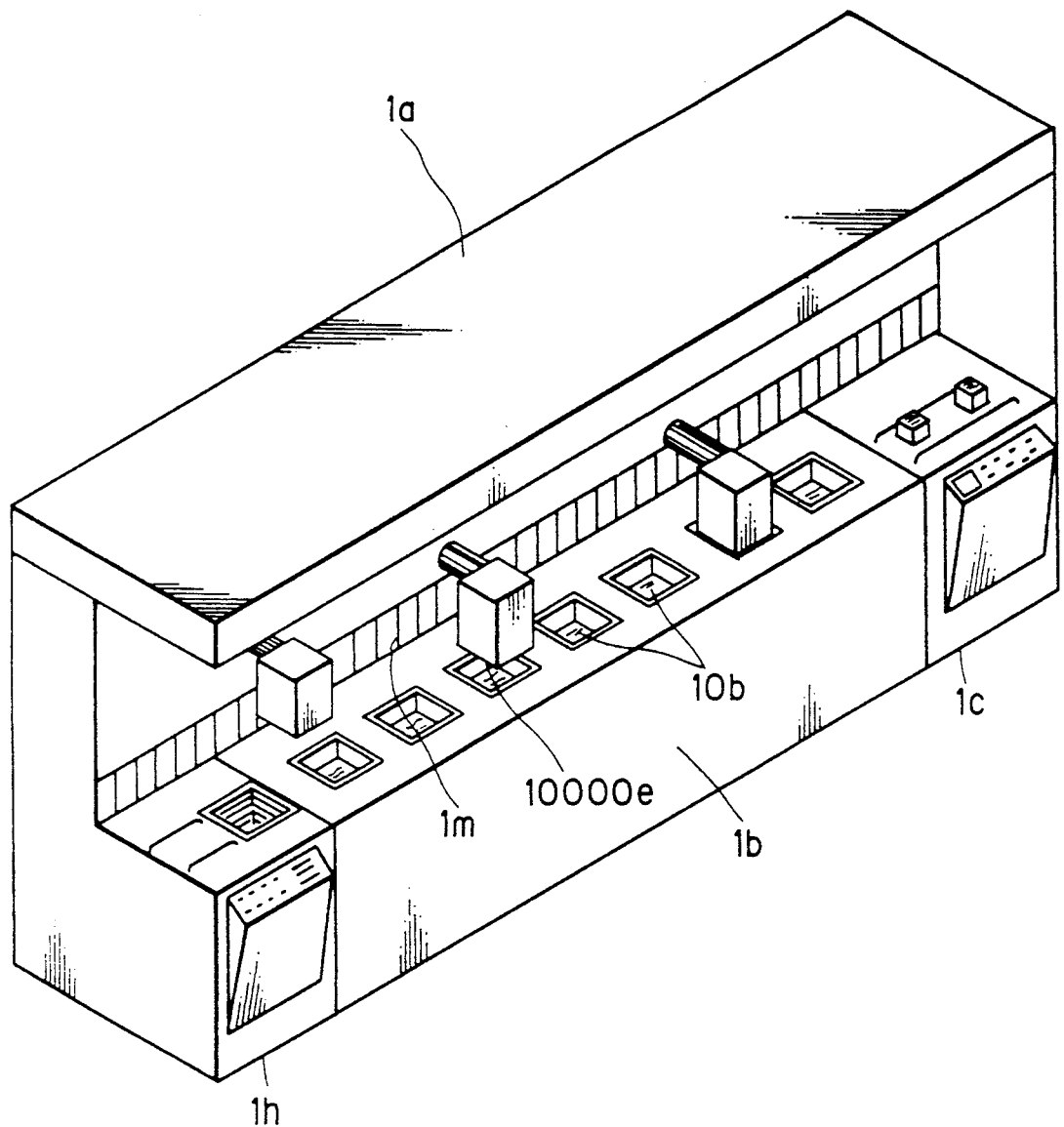
FIG. 16 is overall cross view of the fourth embodiment.

With reference to FIG. 15 and FIG. 16, fourth embodiment of the present invention is explained. In this embodiment, when attachment of exhaust pump to enclosure body is difficult, gas and mist collected in the enclosure body is exhausted by a specially provided exhaust duct.

Figure 17:
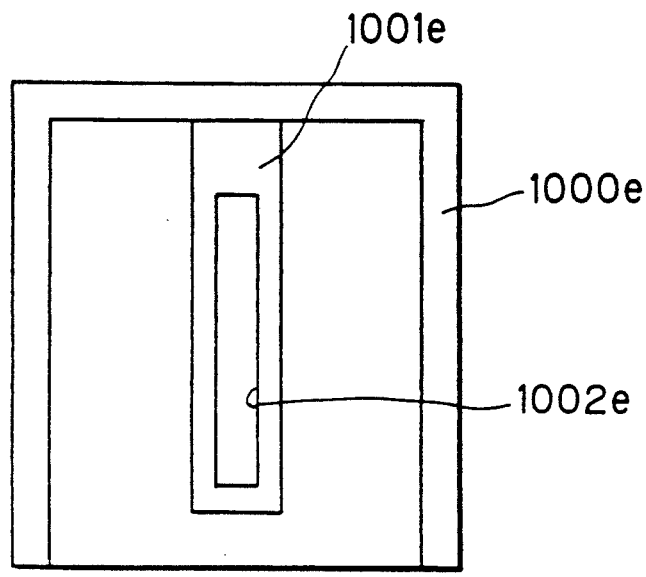
FIG. 17 is back side of enclosure body in the fourth embodiment.

As shown in FIG. 15, the back of the enclosure body 10000e is opened, and gas and mist collected inside the enclosure body 10000e are absorbed and exhausted by exhaust duct 1m provided at the back of cleaning bath portion 1b. This exhaust duct 1m is open, as shown in FIG. 16, over entire movement range of work transporter 1e, and collects gas and mist generating from magazine 1f or semiconductor wafer, regardless of a position of work transporter 1e. In this case, long hole 11e as shown in FIG. 5 cannot be provided at the back of the enclosure body 1000e, so that, as shown in FIG. 17, guide bar 1001e is provided and long hole 1002e is provided at the guide bar 1001e. In each embodiment in the above, enclosure body 10e, 100e, 1000e and 10000e move on work transporter, but its construction may be made so that independent movement mechanism to transfer the enclosure body is provided to synchronously move with work transporter 1e.

Figure 18:
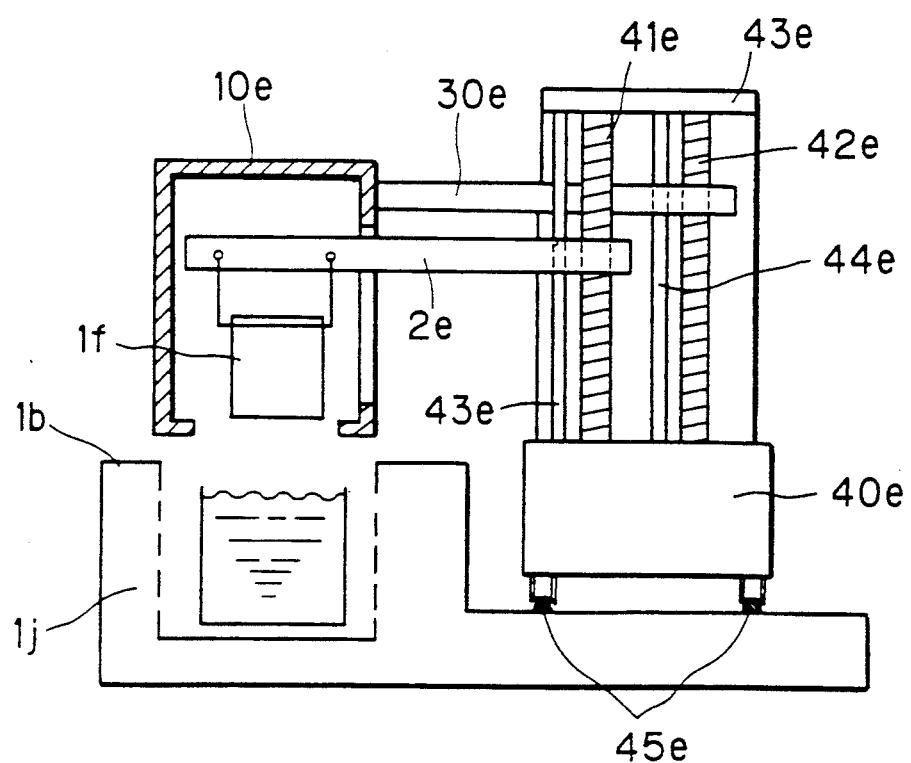
FIG. 18 is a fifth embodiment of the present invention, in which an enclosure body and work transporter horizontal bar portion are separately supported and driven.

FIG. 18 is a schematic drawing, in which enclosure body 10e is separately driven from horizontal bar portion 2e.

In the drawing, work transporter 1 is composed of from base portion 40e, two ball screws 41e and 42e projected upward from the base portion 40e and support portion 43e supporting upper end of the ball screws 41e and 42e. In addition, in the base portion 40e, drive means (not shown) is housed, which independently rotation-drive the ball screws 41e and 42e. An enclosure body support bar 30e supports the enclosure body 10e, and screw hole is provided for the enclosure body support bar 30e and the horizontal bar portion 2e, each being supported by ball screws 41e and 42e. Besides, guide bars 43e and 44e respectively pass through the enclosure body support bar 30e or the horizontal bar portion 2e so that the enclosure body support bar 30e and the horizontal bar portion 2e do not shift in a horizontal direction. By operation of controller 1g (FIG. 1), ball screws 41e and 42e rotate synchronously with transfer process of magazine 1f, and by the screw feeding operation, bar portion 2e and enclosure body 10e go up and down to fill the need.

It is also possible to adopt a simple method, where enclosure body support bar 30e is not driven and fixed to the base portion 40e.

Upon this, the base portion 40e is put on rail 45e and moves in a horizontal direction by drive means (not shown) caused by instruction from the controller 1g. In the above, the immersion cleaning device to clean semiconductor wafer was explained, but the present invention can apply to immersion cleaning device for all work and products and also available for a plating device making immersion treatment.

While the invention has been shown and described in detail, the foregoing description is in all aspects illustrative and not restrictive. It is therefore understood that numerous modifications and variations can be devised without departing from the scope of the invention.

I claim:

1. An immersion cleaning device, comprising:

a plurality of concave portions each housing a chemical bath containing a respective chemical for immersion therein of a workpiece;

first exhaust means to exhaust an inside of each of the concave portions;

transportation means provided with a holding portion for holding said workpiece while said workpiece is moved to selected ones of said chemical baths, said holding portion also being movable for taking said workpiece into and out of said selected chemical baths;

controller means for controlling operation of said transportation means and said holding portion thereof; and an enclosure body of a fixed and predetermined shape and size selected to enclose said workpiece and said holding portion, said enclosure body being disposed in engagement with said holding portion so as to be moved therewith to said selected chemical baths by said transportation means.

2. The immersion cleaning device in accordance with claim 1, wherein:

said transportation means comprises a horizontal member, to which said holding portion is provided at one end; and transfer means connected to another end of the horizontal member for transferring said horizontal member up and down.

3. The immersion cleaning device in accordance with claim 2 wherein:

said enclosure body is provided with a long vertical hole at the back of said enclosure body, said horizontal member being disposed to pass through said long hole and through a sliding member which slides up and down and which is supported at an upper end by said horizontal member.

4. The immersion cleaning device in accordance with claim 3, wherein:

said horizontal member further comprises a seal plate disposed to seal said long hole, a transverse width of said seal plate being at least twice a length of said long hole, said horizontal member acting to make said seal plate contact with said enclosure body back portion while the horizontal member passes through said long hole.

* * * * *

UNITED STATES PATENT AND TRADEMARK OFFICE
CERTIFICATE OF CORRECTION

PATENT NO. : 5,313,966
DATED : May 24, 1994
INVENTOR(S) : Masaaki SADAMORI

It is certified that error appears in the above-identified patent and that said Letters Patent is hereby corrected as shown below:

Column 8, line 23 (after claim 4), add the following claims:

5. The immersion cleaning device in accordance with Claim 1, further comprising:
a support means provided to support said enclosure body so that it can move up and down against said holding portion.

6. The immersion cleaning device in accordance with Claim 2, wherein said enclosure body comprises:
a groove in parallel with said long hole at a position facing said long hole, with which an edge of said horizontal member is engaged.

7. The immersion cleaning device in accordance with Claim 3, wherein said horizontal member has a rectangular section at a portion engaging with said long hole.

UNITED STATES PATENT AND TRADEMARK OFFICE
CERTIFICATE OF CORRECTION

PATENT NO. : 5,313,966

DATED : May 24, 1994

INVENTOR(S) : Masaaki SADAMORI

It is certified that error appears in the above-identified patent and that said Letters Patent is hereby corrected as shown below:

8. The immersion cleaning device in accordance with Claim 6, wherein said edge of said horizontal member has a rectangular section.

9. The immersion cleaning device in accordance with Claim 3, wherein said enclosure body has a bellow-like seal member at said long hole, which is expandable in up and down directions, and through which said horizontal member passes.

10. The immersion cleaning device in accordance with Claim 3, wherein said enclosure body has an elastic film made of elastic material with a slit at the center in the longitudinal direction, of said long hole, and said horizontal member passes through the slit.

11. The immersion cleaning device in accordance with Claim 1, further comprising:
a second exhaust means to exhaust said enclosure body.

UNITED STATES PATENT AND TRADEMARK OFFICE
CERTIFICATE OF CORRECTION

PATENT NO. : 5,313,966

DATED : May 24, 1994

INVENTOR(S) : Masaaki SADAMORI

It is certified that error appears in the above-identified patent and that said Letters Patent is hereby corrected as shown below:

12. The immersion cleaning device in accordance with Claim 11, wherein said second exhaust means contains an exhaust pump directly provided to said enclosure body and an exhaust tube connected to the exhaust pump.

13. The immersion cleaning device in accordance with Claim 11, wherein said exhaust means contains an exhaust tube, one end of which is directly connected to said enclosure body, and an exhaust pump which is connected to the other end of the exhaust tube.

14. The immersion cleaning device in accordance with Claim 5, wherein said enclosure body contains an elastic seal member at the circumference of its bottom edge so that, when said transportation means lowers to immerse said work into said chemical bath, a bottom edge of said enclosure body and upper part of said concave portion closely contact.

UNITED STATES PATENT AND TRADEMARK OFFICE
CERTIFICATE OF CORRECTION

PATENT NO. : 5,313,966
DATED : May 24, 1994
INVENTOR(S) : Masaaki SADAMORI It is certified that error appears in the above-identified patent and that said Letters Patent is hereby corrected as shown below:

15. The immersion cleaning device in accordance with Claim 1, wherein said enclosure body has an opened back portion, and there is further provided an exhaust duct connected to said first exhaust means, at a position facing said opened back portion.

16. The immersion cleaning device in accordance with Claim 2, wherein there is further provided a driving means which transfers said enclosure body up and down synchronously with movement of said transportation means.

17. The immersion cleaning device in accordance with Claim 16, wherein said transportation means further contains a base which transfers said horizontal member in a horizontal direction, wherein said transportation means of said enclosure body is commonly installed on said base.

UNITED STATES PATENT AND TRADEMARK OFFICE
CERTIFICATE OF CORRECTION

PATENT NO. : 5,313,966
DATED : May 24, 1994
INVENTOR(S) : Masaaki SADAMORI

It is certified that error appears in the above-identified patent and that said Letters Patent is hereby corrected as shown below:

18. The immersion cleaning device in accordance with Claim 16, wherein said transportation means of said horizontal member and said transportation means of said enclosure body are respectively provided with a mechanism which transfers vertically by a screw feeding operation caused by ball screw rotation.

Signed and Sealed this

Thirteenth Day of December, 1994

Attest:

BRUCE LEHMAN

Attesting Officer

Commissioner of Patents and Trademarks